United States Patent
Zhang et al.

(10) Patent No.: US 12,391,878 B2
(45) Date of Patent: Aug. 19, 2025

(54) METHOD FOR PREPARING QUANTUM DOT LIGHT-EMITTING DIODES

(71) Applicant: TCL TECHNOLOGY GROUP CORPORATION, Guangdong (CN)

(72) Inventors: Jie Zhang, Guangdon (CN); Chaoyu Xiang, Guangdong (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 986 days.

(21) Appl. No.: 17/419,670

(22) PCT Filed: Sep. 17, 2019

(86) PCT No.: PCT/CN2019/106141
§ 371 (c)(1),
(2) Date: Jun. 29, 2021

(87) PCT Pub. No.: WO2020/134206
PCT Pub. Date: Jul. 2, 2020

(65) Prior Publication Data
US 2022/0073818 A1   Mar. 10, 2022

(30) Foreign Application Priority Data
Dec. 29, 2018 (CN) .......................... 201811635964.8

(51) Int. Cl.
*C09K 11/88*   (2006.01)
*C09K 11/56*   (2006.01)
(Continued)

(52) U.S. Cl.
CPC .......... *C09K 11/883* (2013.01); *C09K 11/565* (2013.01); *H10K 71/135* (2023.02);
(Continued)

(58) Field of Classification Search
CPC ........... H10K 2102/331; H10K 71/135; H10K 85/1135; H10K 71/00; H10K 50/115;
(Continued)

(56) References Cited

U.S. PATENT DOCUMENTS

2008/0238294 A1   10/2008   Xu et al.
2012/0214936 A1   8/2012    Fujita et al.
(Continued)

FOREIGN PATENT DOCUMENTS

CN   1728413 A     2/2006
CN   101540379 A   9/2009
(Continued)

OTHER PUBLICATIONS

International Search Report with English Translation for International Application No. PCT/CN2019/106141; Application Filing Date: Sep. 17, 2019; Date of Mailing: Dec. 19, 2019; 4 pages.
(Continued)

*Primary Examiner* — Joshua Benitez Rosario
*Assistant Examiner* — Christopher A Culbert

(57) ABSTRACT

A method for preparing a quantum dot light-emitting diode, including the following steps: providing a substrate, the substrate is a cathode substrate; or the substrate is an anode substrate provided with a quantum dot light-emitting layer, and the quantum dot light-emitting layer is arranged on the anode surface of the anode substrate; placing the substrate in an inert atmosphere containing a first gas, and printing an electron transport material ink on the substrate surface to prepare an electron transport layer; preparing other film layers on the electron transport layer to prepare a quantum dot light-emitting diode, the quantum dot light-emitting diode at least includes the following structure: an anode and a cathode arranged oppositely, a quantum dot light-emitting layer arranged between the anode and the cathode, and an
(Continued)

Providing a substrate, placing the substrate in an inert atmosphere containing a first gas, and printing an electron transport material ink on a surface of the substrate to prepare an electron transport layer, where the first gas is selected from one or a combination of two or more of halogenated amine gas, ester gas and organic alkali gas — S01 electron transport layer arranged between the quantum dot light-emitting layer and the cathode.

12 Claims, 1 Drawing Sheet

(51) Int. Cl.
  *H10K 50/115* (2023.01)
  *H10K 50/16* (2023.01)
  *H10K 71/00* (2023.01)
  *H10K 71/13* (2023.01)
  *H10K 85/10* (2023.01)
  *H10K 102/00* (2023.01)
  *B82Y 20/00* (2011.01)
  *H10K 50/17* (2023.01)
  *H10K 71/40* (2023.01)

(52) U.S. Cl.
  CPC .......... *H10K 85/1135* (2023.02); *B82Y 20/00* (2013.01); *H10K 50/115* (2023.02); *H10K 50/16* (2023.02); *H10K 50/171* (2023.02); *H10K 71/00* (2023.02); *H10K 71/40* (2023.02); *H10K 2102/00* (2023.02); *H10K 2102/331* (2023.02)

(58) Field of Classification Search
  CPC .... H10K 2102/00; H10K 50/16; H10K 71/40; H10K 50/171; C09K 11/883; C09K 11/565; B82Y 20/00
  See application file for complete search history.

(56) References Cited

U.S. PATENT DOCUMENTS

| 2015/0287927 | A1 | 10/2015 | Okubo et al. |
| 2016/0164008 | A1* | 6/2016 | Sasada ................ H10K 85/115 252/301.16 |
| 2018/0073702 | A1 | 3/2018 | Hartlove et al. |
| 2018/0369861 | A1 | 12/2018 | Katori et al. |

FOREIGN PATENT DOCUMENTS

| CN | 102077384 A | 5/2011 |
| CN | 103772872 A | 5/2014 |
| CN | 104409661 A | 3/2015 |
| CN | 105870345 A | 8/2016 |
| CN | 106281311 A | 1/2017 |
| CN | 106299159 A | 1/2017 |
| CN | 106384768 A | 2/2017 |
| CN | 106565781 A | 4/2017 |
| CN | 107083238 A | 8/2017 |
| CN | 108767125 A | 11/2018 |
| JP | 2017079319 A | 4/2017 |

OTHER PUBLICATIONS

Written Opinion for International Application No. PCT/CN2019/106141; Application Filing Date: Sep. 1, 20197; Date of Mailing: Dec. 1, 20199; 4 pages.

* cited by examiner

Providing a substrate, placing the substrate in an inert atmosphere containing a first gas, and printing an electron transport material ink on a surface of the substrate to prepare an electron transport layer, where the first gas is selected from one or a combination of two or more of halogenated amine gas, ester gas and organic alkali gas — S01 

METHOD FOR PREPARING QUANTUM DOT LIGHT-EMITTING DIODES

CROSS REFERENCE TO RELATED APPLICATIONS

This application is the national phase entry of International Application No. PCT/CN2019/106141, filed on Sep. 17, 2019, which is based upon and claims priority to Chinese Patent Application No. 201811635964.8, filed on Dec. 29, 2018, the entire contents each of which are incorporated herein by reference.

TECHNICAL FIELD

The present application relates to the field of display technology, in particular to a method for preparing quantum dot light-emitting diodes.

BACKGROUND

Quantum dots, also known as semiconductor nanocrystals, whose three-dimensional size is within the nanometer range (1-100 nm), is a theory of nanoparticle between bulk phase materials and molecules. Quantum dots have excellent optical properties such as high quantum yield, large molar extinction coefficient, good optical stability, narrow half-peak width, wide excitation spectrum and controllable emission spectrum, etc., and are very suitable for use as luminescent materials for light-emitting devices. In recent years, quantum dot fluorescent materials have been widely used in the field of flat panel displays due to their high light color purity, adjustable luminous color, and long service life, becoming a promising next-generation display and solid-state lighting source. The Quantum Dot light-emitting diode (QLED) is a light-emitting device based on quantum dot material as a luminescent material. Due to its advantages such as adjustable wavelength, narrow emission spectrum, high stability, and high quantum yield of electroluminescence, etc., it has become a strong competitor in the next a generation of display technology.

However, the existing methods for preparing quantum dot light-emitting diodes still need to be improved.

Technical Problem

It has been found that solution processing is a common method for preparing QLED devices, especially with the development of technology, it becomes routine to prepare quantum dot light-emitting layers by using inkjet printing technology. When using the ink-jet printing technology to prepare the electron transport layer, the requirements for the ink of the electron transport layer are relatively high. It is necessary to ensure not only good printability but also good solution stability. However, the efficiency of quantum dot light-emitting diode devices and the ink printability are often difficult to balance, and ink devices with better printability are usually not efficient.

One of the purposes of the embodiments of the present application is to provide a method for preparing quantum dot light-emitting diodes, which aims to solve the problem that the efficiency of quantum dot light-emitting diode devices and ink printability are often difficult to balance when inkjet printing electron transport layers, and the ink device with better printability has low efficiency.

Technical Solutions

In order to solve the above technical problems, the technical solutions adapted in the embodiments of this application are as follows:

In a first aspect, a method for preparing a quantum dot light-emitting diodes is provided, which includes the following steps:

providing a substrate, placing the substrate in an inert atmosphere containing a first gas, and printing an electron transport material ink on a surface of the substrate to prepare an electron transport layer, where the first gas is selected from one or a combination of two or more of halogenated amine gas, ester gas and organic alkali gas.

In one embodiment, the halogenated amine gas is selected from one or more of ammonium fluoride gas, ammonium chloride gas and ammonium iodide gas;

The ester gas is selected from one or more of methyl methacrylate gas, ethyl crotonate gas, ethyl acetate gas and methyl benzoate gas;

The organic base is selected from one or more of ethanolamine gas, tetramethylammonium hydroxide gas, aniline gas and triethanolamine gas.

In an embodiment, the electron transport material in the electron transport material ink is selected from one or more of ZnO, $TiO_2$, $SnO_2$, $Ta_2O_3$, $ZrO_2$, NiO, TiLiO, ZnAlO, ZnMgO, ZnSnO, ZnLiO, and InSnO.

In an embodiment, the first gas accounts for 0.001%-20% in mole percentage of the overall gas atmosphere.

In an embodiment, the first gas accounts for 0.005%-3% in mole percentage of the overall gas atmosphere.

In an embodiment, the first gas accounts for 0.01%-0.1%. in mole percentage of the overall gas atmosphere In an embodiment, the first gas is selected from a combination of two or more of the halogenated amine gas, the ester gas and the organic alkali gas.

In an embodiment, the first gas is selected from a combination of one or more ester gases and one or more organic alkali gases; or The first gas is a mixed first gas consisted of at least one of unsaturated fatty acids and at least one of organic bases.

In an embodiment, placing the substrate in the inert atmosphere containing the first gas, and printing the electron transport material ink on the surface of the substrate under a temperature of 10° C. to 80° C. to prepare the electron transport layer.

In an embodiment, placing the substrate in the inert atmosphere containing the first gas, and printing the electron transport material ink on the surface of the substrate under at a temperature of 30° C.-50° C. to prepare the electron transport layer.

In an embodiment, the inert atmosphere is a helium atmosphere, a neon atmosphere, an argon atmosphere, a krypton atmosphere or a nitrogen atmosphere.

In an embodiment, the substrate is an anode substrate provided with a quantum dot light-emitting layer, including: an anode substrate, a quantum dot light-emitting layer provided on the anode substrate; and the electron transport layer is prepared on a surface of the quantum dot light-emitting layer away from the anode substrate.

In an embodiment, the method further includes preparing a hole function layer on a surface of the anode, and the hole function layer includes at least one of a hole injection layer, a hole transport layer and an electron barrier layer.

In an embodiment, the substrate is a cathode substrate, the cathode substrate includes a base plate, and a cathode disposed on the base plate; the electron transport layer is prepared on a surface of the cathode facing away from the base plate.

In an embodiment, before preparing the electron transport layer, preparing an electron injection layer on the surface of the cathode.

The method for preparing the quantum dot light-emitting diode provided in the embodiments of the present application has beneficial effects in that: by changing the ink-jet printing film forming atmosphere, the electron transport layer is prepared in an inert atmosphere containing the first gas, which can ensure the printing performance of the electron transport material ink and meanwhile the device efficiency of quantum dot light-emitting diodes is improved.

BRIEF DESCRIPTION OF DRAWINGS

In order to explain the technical solution in the embodiments of the present application more clearly, the drawings used in the embodiments or exemplary technical descriptions will be briefly described hereinbelow. Obviously, the drawings in the following description are some embodiments of the present application, and for persons skilled in the art, other drawings may also be obtained on the basis of these drawings without any creative work.

FIG. 1 is a flowchart of a method for preparing a quantum dot light-emitting diode in accordance with an embodiment of the present application.

DETAILED DESCRIPTION OF THE EMBODIMENTS

In order to make the objectives, technical solutions, and advantages of the present application more comprehensible, the following further describes the present application in detail with reference to the drawings and embodiments. It should be understood that the specific embodiments described here are merely used to illustrate the present application, and are not intended to limit the present application.

It should be noted that the terms "first" and "second" are merely used for descriptive purposes, and cannot be understood as indicating or implying relative importance or implicitly indicating the number of indicated technical features. Thus, the features defined with "first" and "second" may explicitly or implicitly include one or more of these features. In the description of the present application, "multiple" means two or more than two, unless otherwise specifically defined.

In order to illustrate the technical solutions described in the present application, the detailed description will be given below in conjunction with specific drawings and embodiments.

As shown in FIG. 1, some embodiments of the present application provide a method for preparing a quantum dot light-emitting diode, which includes the following step:
  providing a substrate, placing the substrate in an inert atmosphere containing a first gas, and printing an electron transport material ink on a surface of the substrate to prepare an electron transport layer, in which the first gas is selected from one or a combination of two or more of halogenated amine gas, ester gas and organic alkali gas.

Specifically, quantum dot light-emitting diodes has a positive-type structure and a negative-type structure. The positive structure includes an anode, a cathode, and a quantum dot light-emitting layer arranged between the anode and the cathode. The anode of the positive structure is arranged on the substrate, and a hole function layer, such as a hole transport layer, a hole injection layer, and an electron barrier layer can also be arranged between the anode and the quantum dot light-emitting layer, and an electron function layer such as an electron transport layer, an electron injection layer and a hole barrier layer can also be arranged between the cathode and the quantum dot light-emitting layer. The negative-type structure includes an anode, a cathode, and a quantum dot light-emitting layer arranged between the anode and the cathode. The cathode of the negative-type structure is arranged on the substrate, and a hole function layer, such as a hole transport layer, a hole injection layer and an electron barrier layer can also be arranged between the anode and the quantum dot light-emitting layer, and an electron function layer such as an electron transport layer, an electron injection layer and a hole barrier layer can also be arranged between the cathode and the quantum dot light-emitting layer.

For a positive-type device, the substrate of the embodiment of the present application may only be a two-layer structure formed by stacking a substrate and an anode and a quantum dot light-emitting layer provided thereon. In some embodiments of the present application, one or more hole function layers such as a hole transport layer, a hole injection layer and an electron barrier layer may be provided between the anode and the quantum dot light-emitting layer to form the substrate of the embodiment of the present application.

Specifically, in one embodiment, the substrate is an anode substrate provided with a quantum dot light-emitting layer, including: an anode substrate and a quantum dot light-emitting layer provided on the anode substrate. At this time, the substrate may be prepared by the following method: providing a substrate provided with an anode, that is, an anode substrate, preparing a quantum dot light-emitting layer on the surface of the anode, and preparing an electron transport layer on the surface of the quantum dot light-emitting layer.

Among them, the anode substrate includes a substrate, and an anode provided on the substrate. The selection of the substrate is not strictly limited, a hard substrate such as a glass substrate may be used; a flexible substrate such as a polyimide substrate or a polynorbornene substrate may also be used, but it is not limited thereto. In some embodiments, the anode may be ITO, but it is not limited thereto.

In some embodiments, a solution processing may be used to deposit a quantum dot solution on the anode to prepare a quantum dot light-emitting layer. In some embodiments of the present application, an inkjet printing method is used to deposit quantum dot ink on the bottom electrode to prepare a quantum dot light-emitting layer. In the embodiments of the present application, the quantum dots in the quantum dot light-emitting layer are conventional quantum dots in the art. In some embodiments, the quantum dot light-emitting layer has a thickness of 30-50 nm.

On the basis of the foregoing embodiments, in order to obtain better device performance, other function layers may be provided.

In some embodiments, in the step of preparing a hole function layer on the surface of the anode (the hole function layer is disposed between the anode and the quantum dot light-emitting layer). The hole function layer includes at least one of a hole injection layer, a hole transport layer and an electron barrier layer. In which, the hole injection layer and the hole transport layer are configured to reduce the difficulty of hole injection, and the electron barrier layer is configured to block excess electrons so that the excess electrons cannot reach the anode to form a leakage current, thereby improving a current efficiency of the quantum dot light-emitting diode. In some embodiments of the present application, when an anode is provided on the substrate to form an anode substrate, before preparing the quantum dot light-emitting layer, the method further includes: preparing a hole injection layer on the anode surface of the substrate, and preparing a hole transport layer on a side of the hole injection layer facing away from the anode. In which, the material of the hole injection layer may be a conventional hole injection material, including but not limited to PEDOT:PSS. The material of the hole transport layer can be conventional hole transport materials, including but not limited to organic materials such as NPB and TFB, inorganic materials such as NiO, MoO3 and their composites. The hole transport layer has a thickness of 10-100 nm.

When the prepared quantum dot light-emitting diode is a negative-type device, the substrate of the embodiment of the present application may only include a substrate and a cathode provided on the substrate. In some embodiments of the present application, an electron injection layer may also be provided between the cathode and the electron transport layer.

Specifically, the substrate is a cathode substrate, and the cathode substrate includes a base plate and a cathode disposed on the base plate. The substrate is selected as described above. In some embodiments, the cathode may be a metal electrode, including but not limited to a silver electrode or an aluminum electrode. The thickness of the cathode is 60-120 nm, preferably 100 nm.

On the basis of the foregoing embodiments, in order to obtain better device performance, other function layers may be provided.

In some embodiments, before preparing the electron transport layer, an electron injection layer is prepared on the surface of the cathode. In which, the electron injection layer and the electron transport layer are configured to reduce the difficulty of electron injection, and the hole barrier layer is configured to block excess holes so that the excess holes cannot reach the cathode to form a leakage current, thereby improving the current efficiency of the quantum dot light-emitting diode. In some embodiments of the present application, before preparing the electron transport layer, the method further includes: preparing an electron injection layer on the surface of the cathode. The material of the electron injection layer may be a conventional electron hole injection material, including but not limited to LiF and CsF, and the thickness of the electron transport layer is 10-100 nm. The material of the electron transport layer may be a conventional electron transport material, including but not limited to the electron transport material in the electron transport material ink which is selected from one or more of ZnO, $TiO_2$, $SnO_2$, $Ta_2O_3$, $ZrO_2$, NiO, TiLiO, ZnAlO, ZnMgO, ZnSnO, ZnLiO and InSnO, preferably zinc oxide, and the thickness of the electron transport layer is 10-100 nm.

By placing the substrate in an inert atmosphere containing the first gas, changing the ink-jet printing film-forming atmosphere, and preparing the electron transport layer in the inert atmosphere containing the first gas, the printability of the electron transport material ink can be ensured while the device efficiency of the quantum dot light-emitting diode is improved.

In some embodiments, the first gas is selected from one or a combination of two or more of halogenated amine gas, ester gas, and organic alkali gas.

In some embodiments, the halogenated amine gas is selected from one or more of ammonium fluoride gas, ammonium chloride gas, and ammonium iodide gas. In some embodiments, the ester gas is selected from one or more of methyl methacrylate gas, ethyl crotonate gas, ethyl acetate gas and methyl benzoate gas. In some embodiments, the organic alkali gas is selected from one or more of ethanolamine gas, tetramethylammonium hydroxide gas, aniline gas and triethanolamine gas.

In some embodiments, the first gas is selected from a combination of two or more halogenated amine gas, ester gas, and organic alkali gas. In some embodiments, the first gas is a mixed first gas consisted of at least one of unsaturated fatty acids and at least one of organic bases.

On the basis of the foregoing embodiment, the first gas accounts for 0.001%-20% of the molar percentage of the overall gas atmosphere. If the content of the first gas is too high, larger than 20%, it will affect the material properties of the electron transport layer. In addition, when the quantum dot light-emitting layer has been seized on the substrate, under the condition of high first gas content, the quantum dots in the quantum dot light-emitting layer are quenched, which affects the light-emitting performance of the quantum dots. In some embodiments of the present application, the first gas accounts for less than 0.005%-3% of the molar percentage of the overall gas atmosphere, so that the electron transport layer prepared by inkjet printing has both good printability and light-emitting performance. In some embodiments of the present application, the first gas accounts for 0.01%-0.1% or less of the molar percentage of the overall gas atmosphere.

In the embodiment of the present application, a conventional inkjet printing method is used for printing the electronic transmission material ink on the surface of the substrate, and the electronic transmission material ink is a conventional electronic transmission material ink, which is not limited here.

The substrate is placed in an inert atmosphere containing the first gas, and the electron transport material ink id printed on the surface of the substrate to prepare the electron transport layer under a temperature of 10° C. to 80° C., which can increase the effect of the first gas for improving the carrier transport performance of the electron transport layer. Specifically, the temperature for preparing the electron transport layer is determined according to the type of the first gas selected. The higher the boiling point of the first gas, the higher the temperature for preparing the quantum dot light-emitting layer. In some embodiments of the present application, the electron transport material ink is printed on the surface of the substrate to prepare an electron transport layer under a temperature of 30° C. to 50° C., which can better improve the effect of the carrier transport performance of the electron transport layer.

In the embodiment of the present application, the inert atmosphere is helium, neon, argon, krypton, or nitrogen.

In the above step S03, another film layer is prepared on the electron transport layer to prepare a quantum dot light-emitting diode, and the quantum dot light-emitting diode at least includes: an anode and a cathode arranged oppositely, a quantum dot light-emitting layer arranged between the anode and the cathode, and an electron transport layer arranged between the quantum dot light-emitting layer and the cathode.

In an exemplary implementation, when the substrate includes an anode substrate and a quantum dot light-emitting layer disposed on the anode substrate, the cathode is prepared on the side of the electron transport layer away from the anode, after the electron transport layer is prepared. The selection of the cathode is as described above.

In some embodiments of the present application, before preparing the cathode, an electron injection layer is prepared on the side of the electron transport layer away from the anode. The selection of the electron injection layer is as described above.

In another exemplary implementation, when the substrate includes a cathode substrate, the quantum dot light emitting layer is prepared on the side of the electron transport layer away from the cathode, after the electron transport layer is prepared, and the anode is prepared on the surface of the quantum dot light-emitting layer facing away from the cathode. The selection of the quantum dot light-emitting layer and the anode are as described above.

In some embodiments, the quantum dot light-emitting layer is prepared after the hole barrier layer is prepared on the side of the electron transport layer away from the cathode. The selection of the hole barrier layer is as described above.

In some embodiments, the anode is prepared after the hole function layer is prepared on the surface of the quantum dot light-emitting layer away from the cathode. The selection of the hole function layer is as described above.

The description will be given below in conjunction with specific embodiments.

Example 1

A method for preparing quantum dot light-emitting diodes includes the following steps:
Providing a glass substrate provided with an anode (ITO), preparing a hole injection layer (PEDOT:PSS) on the anode, preparing a hole transport layer (TFB) on a side of the hole injection layer away from the anode, and preparing a quantum dot light-emitting layer (CdSe/ZnS QDs) on the side of the hole transport layer away from the anode;
Placing the substrate in an inert atmosphere containing methyl methacrylate, and printing an electron transport material ink on the surface of the quantum dot light-emitting layer under the condition of an ambient temperature of 40° C. to prepare an electron transport layer (ZnO); The molar percentage of methyl acrylate is 0.1%;
Preparing an electron injection layer (LiF) on the surface of the electron transport layer away from the anode, and preparing an aluminum cathode on the surface of the electron injection layer away from the anode.

Example 2

A method for preparing a quantum dot light-emitting diode, which is different from Example 1 in that: the molar percentage of methyl methacrylate is 0.05%.

Example 3

A method for preparing a quantum dot light-emitting diode, which is different from Example 1 in that: the molar percentage of methyl methacrylate is 0.025%.

Comparative Example 1

A method for preparing quantum dot light-emitting diodes. The difference from Example 1 is that: the electron transport material ink is printed on the surface of the quantum dot light-emitting layer directly under the condition of an ambient temperature of 40° C. to prepare an electron transport layer (ZnO), That is, it does not contain the condition that "the substrate is placed in an inert atmosphere containing methyl methacrylate, and the molar percentage of methyl methacrylate is 0.1%".

The external quantum efficiency (%) of the quantum dot light-emitting diodes prepared in Examples 1 to 3 and Comparative Example 1 after energization and curing were measured respectively, and the results are shown in Table 1 below.

TABLE 1

| External Quantum Efficiency (%) | 1 day later | 2 days later | 3 days later | 4 days later |
| --- | --- | --- | --- | --- |
| Example 1 | 3.2 | 5.3 | 6.4 | 5.8 |
| Example 2 | 3.4 | 5.8 | 7.1 | 6.3 |
| Example 3 | 3.4 | 5.5 | 6.7 | 6.0 |
| Comparative example 1 | 3.4 | 5.1 | 6.2 | 5.7 |

It can be seen from Table 1, compared to the quantum dot light-emitting diode device that has not been treated with the methyl methacrylate first gas when inkjet printing the quantum dot light-emitting diode in Comparative Example 1, Examples 1-3 of the present application where the external quantum efficiency of devices treated with methyl methacrylate is generally effectively improved. When the molar percentage of methyl methacrylate in the overall atmosphere is 0.05%, the external quantum efficiency increases the most.

Example 4

A method for preparing quantum dot light-emitting diodes includes the following steps:
Providing a glass substrate provided with an anode (ITO), preparing a hole injection layer (PEDOT:PSS) on the anode, preparing a hole transport layer (TFB) on the side of the hole injection layer away from the anode, and preparing a quantum dot light-emitting layer (CdSe/ZnS QDs) on the side of the hole transport layer away from the anode;
Placing the substrate in an inert atmosphere containing methyl methacrylate, and printing the electron transport material ink on the surface of the quantum dot light-emitting layer under the condition of an ambient temperature of 30° C. to prepare an electron transport layer (ZnO). The molar percentage of methyl acrylate is 0.05%;
Preparing an electron injection layer (LiF) on the surface of the electron transport layer away from the anode, and preparing an aluminum cathode on the surface of the electron injection layer away from the anode.

Example 5

A method for preparing a quantum dot light-emitting diode, which is different from Example 4 in that: the electron transport material ink is printed on the surface of the quantum dot light-emitting layer to prepare an electron transport layer (ZnO) under the condition of an ambient temperature of 40° C. Among them, the molar percentage of methyl methacrylate is 0.05%.

Example 6

A method for preparing a quantum dot light-emitting diode, which is different from Example 4 in that: the electron transport material ink is printed on the surface of the quantum dot light-emitting layer to prepare an electron transport layer (ZnO) under the condition of an ambient temperature of 50° C. Among them, the molar percentage of methyl methacrylate is 0.05%.

Example 7

A method for preparing a quantum dot light-emitting diode, which is different from Example 4 in that: the electron transport material ink is printed on the surface of the quantum dot light-emitting layer to prepare an electron transport layer (ZnO) under the condition of an ambient temperature of 60° C. Among them, the molar percentage of methyl methacrylate is 0.05%.

Example 8

A method for preparing a quantum dot light-emitting diode, which is different from Example 4 in that: the electron transport material ink is printed on the surface of the quantum dot light-emitting layer to prepare an electron transport layer (ZnO) under the condition of an ambient temperature of 70° C. Among them, the molar percentage of methyl methacrylate is 0.05%.

Comparative Example 2

A method for preparing quantum dot light-emitting diodes includes the following steps:
  Providing a glass substrate provided with an anode (ITO), preparing a hole injection layer (PEDOT:PSS) on the anode, preparing a hole transport layer (TFB) on the side of the hole injection layer away from the anode, and preparing the quantum dot light-emitting layer (CdSe/ZnS QDs) on the side of the hole transport layer away from the anode;
  Printing the electron transport material ink on the surface of the quantum dot light-emitting layer under the condition of an ambient temperature of 30° C. to prepare an electron transport layer (ZnO);
  Preparing an electron injection layer (LiF) on the surface of the electron transport layer away from the anode, and preparing an aluminum cathode on the surface of the electron injection layer away from the anode.

Comparative Example 3

A method for preparing quantum dot light-emitting diodes which is different from Comparative Example 2 in that the electron transport material ink is printed on the surface of the quantum dot light-emitting layer under the condition of an ambient temperature of 40° C. to prepare an electron transport layer (ZnO).

Comparative Example 4

A method for preparing quantum dot light-emitting diodes which is different from Comparative Example 2 in that the electron transport material ink is printed on the surface of the quantum dot light-emitting layer under the condition of an ambient temperature of 50° C. to prepare an electron transport layer (ZnO).

Comparative Example 5

A method for preparing quantum dot light-emitting diodes, which is different from Comparative Example 2 in that the electron transport material ink is printed on the surface of the quantum dot light-emitting layer under the condition of an ambient temperature of 60° C. to prepare an electron transport layer (ZnO).

Comparative Example 6

A method for preparing quantum dot light-emitting diodes, which is different from Comparative Example 2 in that the electron transport material ink is printed on the surface of the quantum dot light-emitting layer under the condition of an ambient temperature of 70° C. to prepare an electron transport layer (ZnO).

The device lifetimes (T50@100 nits~hrs) of the quantum dot light-emitting diodes of Examples 4-8 and Comparative Examples 2-6 were tested respectively, as shown in Table 2 below.

TABLE 2

| Device Lifetime (h) | Temperature (° C.) | | | | |
|---|---|---|---|---|---|
| | 30 | 40 | 50 | 60 | 70 |
| Example 4 | 337 | — | — | — | — |
| Example 5 | — | 392 | — | — | — |
| Example 6 | — | — | 354 | — | — |
| Example 7 | — | — | — | 288 | — |
| Example 8 | — | — | — | — | 265 |
| Comparative example 2 | 315 | — | — | — | — |
| Comparative example 3 | — | 357 | — | — | — |
| Comparative example 4 | — | — | 281 | — | — |
| Comparative example 5 | — | — | — | 263 | — |
| Comparative example 6 | — | — | — | — | 240 |

It can be seen from Table 2 that when the electron transport layer is prepared by the same inkjet printing method under the same temperature conditions, the lifetime of the quantum dot light-emitting diode device treated with the methyl methacrylate first gas is improved. However, in Examples 4-8, when dried at a low temperature of 40° C., the lifetime of the device is longer.

The above embodiments are only optional embodiments of the present application, which are not used to limit the present application. For those skilled in the art, the present application can have various modifications and changes. Any modification, equivalent replacement, improvement, etc. made within the spirit and principle of the present application shall be included in the scope of the claims of the present application.

The invention claimed is:
1. A method for preparing a quantum dot light-emitting diode comprising:
  providing a substrate, placing the substrate in a mixed gas atmosphere containing a first gas and an inert atmosphere, and printing an electron transport material ink on a surface of the substrate to prepare an electron transport layer, wherein the first gas is an ester gas, and the ester gas is selected from one or more of methyl methacrylate gas, ethyl crotonate gas, ethyl acetate gas and methyl benzoate gases.

2. The method for preparing the quantum dot light-emitting diode according to claim 1, wherein an electron transport material in the electron transport material ink is selected from one or more of ZnO, $TiO_2$, $SnO_2$, $Ta_2O_3$, $ZrO_2$, NiO, TiLiO, ZnAlO, ZnMgO, ZnSnO, ZnLiO and InSnO.

3. The method for preparing the quantum dot light-emitting diode according to claim 1, wherein the first gas accounts for 0.001%-20% in mole percentage of the mixed gas atmosphere.

4. The method for preparing the quantum dot light-emitting diode according to claim 3, wherein the first gas accounts for 0.005% to 3% in mole percentage of the mixed gas atmosphere.

5. The method for preparing the quantum dot light-emitting diode according to claim 4, wherein the first gas accounts for 0.01%-0.1% in mole percentage of the mixed gas atmosphere.

6. The method for preparing the quantum dot light-emitting diode according to claim 1, wherein the substrate is placed in the mixed gas atmosphere containing the first gas, and the electron transport material ink is printed on the surface of the substrate at a temperature of 10° C. to 80° C., to prepare the electron transport layer.

7. The method for preparing the quantum dot light-emitting diode according to claim 6, wherein the substrate is placed in the mixed gas atmosphere containing the first gas, and the electron transport material ink is printed on the surface of the substrate at the temperature of 30° C.-50° C. to prepare the electron transport layer.

8. The method for preparing the quantum dot light-emitting diode according to claim 1, wherein the inert atmosphere is a helium atmosphere, a neon atmosphere, an argon atmosphere, a krypton atmosphere or a nitrogen atmosphere.

9. The method for preparing the quantum dot light-emitting diode according to claim 1, wherein the substrate is an anode substrate provided with a quantum dot light-emitting layer, which comprises: an anode substrate, a quantum dot light-emitting layer provided on the anode substrate; wherein the electron transport layer is prepared on a surface of the quantum dot light-emitting layer away from the anode substrate.

10. The method for preparing the quantum dot light-emitting diode according to claim 9, further comprising: preparing a hole function layer on the surface of the anode, and the hole function layer comprises at least one of a hole injection layer, a hole transport layer and an electron barrier layer.

11. The method for preparing the quantum dot light-emitting diode according to claim 1, wherein the substrate is a cathode substrate, the cathode substrate comprises a substratum, and a cathode disposed on the substratum; the electron transport layer is prepared on a surface of the cathode away from the substratum.

12. The method for preparing the quantum dot light-emitting diode according to claim 11, wherein before preparing the electron transport layer, preparing an electron injection layer on the surface of the cathode.

* * * * *